(12) United States Patent
Sanchez (10) Patent No.: US 8,604,867 B2
(45) Date of Patent: Dec. 10, 2013

(54) ENERGY HARVESTING IN INTEGRATED CIRCUIT PACKAGES

(75) Inventor: Henry L. Sanchez, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 108 days.

(21) Appl. No.: 13/304,737

(22) Filed: Nov. 28, 2011

(65) Prior Publication Data
US 2013/0134544 A1 May 30, 2013

(51) Int. Cl.
| H01L 35/28 | (2006.01) |
| H01L 35/02 | (2006.01) |
| H01L 35/34 | (2006.01) |

(52) U.S. Cl.
USPC ............. 327/512; 136/203; 136/205; 438/54; 257/467; 257/E31.055

(58) Field of Classification Search
USPC .................. 257/467, 470, E21.002, E31.055; 136/203, 205; 327/512; 438/54
See application file for complete search history.

(56) References Cited

U.S. PATENT DOCUMENTS

| 5,419,780 | A | 5/1995 | Suski |
| 6,614,109 | B2 | 9/2003 | Cordes et al. |
| 7,807,917 | B2 | 10/2010 | Atanackovic |
| 7,855,397 | B2 | 12/2010 | Alley et al. |
| 2005/0077619 | A1 | 4/2005 | Ramanathan et al. |
| 2007/0089773 | A1 | 4/2007 | Koester et al. |
| 2009/0283124 | A1 | 11/2009 | Seo |
| 2010/0044704 | A1 | 2/2010 | Male et al. |
| 2010/0079959 | A1 | 4/2010 | Letz |
| 2010/0163090 | A1 | 7/2010 | Liu et al. |
| 2010/0219525 | A1 | 9/2010 | Ibaraki et al. |
| 2010/0308898 | A1 | 12/2010 | Rivero et al. |
| 2011/0233761 | A1 | 9/2011 | Hwang et al. |
| 2013/0081662 | A1* | 4/2013 | Dibra ............................ 136/203 |

OTHER PUBLICATIONS

International Search Report and Written Opinion—PCT/US2012/066903—ISA/EPO—May 23, 2013.

* cited by examiner

*Primary Examiner* — Whitney T Moore
(74) *Attorney, Agent, or Firm* — Michelle S. Gallardo (57) ABSTRACT

An energy harvesting integrated circuit (IC) includes electrical connectors, each having a portion of a first material and a portion of a second material. The first and the second materials have a thermoelectric potential. The IC includes a trace of the first material coupled to the first material of each electrical connector, and a trace of the second material coupled to the second material of each electrical connector and the first trace. A portion of the second trace extends away from a portion of the first trace. The IC has charge storing elements coupled to the first and/or second traces. The first material and the second material are heated to create an electron flow from a thermal gradient between a first zone of the heated first and second materials and a second zone of the first and the second materials away from the first zone.

22 Claims, 7 Drawing Sheets

ENERGY HARVESTING IN INTEGRATED CIRCUIT PACKAGES

TECHNICAL FIELD

The present description is related, generally, to integrated circuits, more specifically, to energy harvesting in integrated circuit packages.

BACKGROUND

Microprocessors, modems, power management integrated circuits (PMIC), graphics processors and other high-end chips within electronic devices, generate heat that can limit the performance of the devices. The majority of heat generated by these ICs is untapped thermal energy. It would be desirable to develop an electric power supply capable of recycling thermal energy generated by an electronic device (or IC device), such as a handheld device or a computer, to reduce overall power consumption.

Electronic devices, such as handheld devices, use capacitors (referred to as "supercaps") to maintain a minimum voltage when a battery of the electronic device is disconnected. Although supercaps are a "greener," low cost solution compared to Vcoin (lithium) cells, the supercaps can occupy a significant amount of space within the package of the ICs. It would be desirable to recycle thermal energy of the ICs into electrical energy to allow for a reduction in the size of the supercaps.

SUMMARY

According to an aspect of the present disclosure, an energy harvesting integrated circuit (IC) includes electrical connectors. Each connector is made of a first material and a second material. The first and the second materials have a thermoelectric potential. The energy harvesting IC also includes a trace of the first material coupled to the first material of each electrical connector, and a trace of the second material coupled to the second material of each electrical connector and also the trace of the first material. A portion of the second trace extends away from a portion of the first trace. The IC also has charge storing elements coupled to at least one of the first and second traces.

According to another aspect of the present disclosure, a method includes coupling a first material of each electrical connector of a group of electrical connectors to a trace of the first material. A second material of each electrical connector is coupled to a trace of the second material. The first material and the second material have a thermoelectric potential. A portion of the trace of the first material is extended away from a portion of the trace of the second material. Charge storing elements are coupled to at least one of the traces.

In yet another aspect, an energy harvesting integrated circuit (IC) has means for electrically connecting integrated circuit devices. Each connecting means comprises a first material and a second material, the first and the second materials having a thermoelectric potential. The IC also has a trace of the first material coupled to the first material of each connecting means, and a trace of the second material coupled to the second material of each connecting means and also the first trace. A portion of the second trace extends away from a portion of the first trace. The IC further includes means for storing electric charge coupled to at least one of the first and second traces.

Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present teachings, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

The integrated circuit device described herein may be a wired or wireless device or any electronic device used for communication, computing, networking, and other applications. For example, the integrated circuit device may be a cellular phone, a personal digital assistant (PDA), a wireless modem card, an access point, or some other device used for wireless communication. The wireless device may also be called a mobile station, a user equipment, a terminal, a subscriber unit, a station, or some other terminology.

In some aspects, the integrated circuit device described herein may be used for various wireless communication systems such as a code division multiple access (CDMA) system, a time division multiple access (TDMA) system, a frequency division multiple access (FDMA) system, an orthogonal frequency division multiple access (OFDMA) system, an orthogonal frequency division multiplexing (OFDM) system, a single-carrier frequency division multiple access (SC-FDMA) system, and other systems that transmit modulated data. The terms "network" and "system" are often used interchangeably.

In some aspects of the disclosure, heat energy is recycled into electrical energy based on thermoelectric properties of a copper (Cu) and a copper oxide (CuO) layer interface. The copper (Cu) and copper oxide (CuO) layer interface can be implemented on a packaging technology, e.g., copper pillar on a bond on lead (Cu-BOL) package. Although the description is primarily with respect to pillars, other structures are also considered to be within the scope of the present disclosure. For example, any structure having a copper-copper oxide junction as a thermoelectric energy harvesting engine is considered to be within the scope of the present disclosure.

In electronic packaging, a chip package can include a pillar that extends from a contact on a die or wafer to a solder connection on a packaging substrate. Similarly, a copper connection (e.g., a pillar) can be provided between two stacked dies, between a packaging substrate and a printed circuit board (PCB), or even between two packages in a package on package (POP) configuration. The solder connection, for example, can be a solder on pad (SOP) connection. The pillar can be substantially cylindrical and can form an electrically conductive interconnect with the substrate/die/PCB through the SOP. A conventional pillar is metallic and does not include any external coating or layer.

Figure 1:
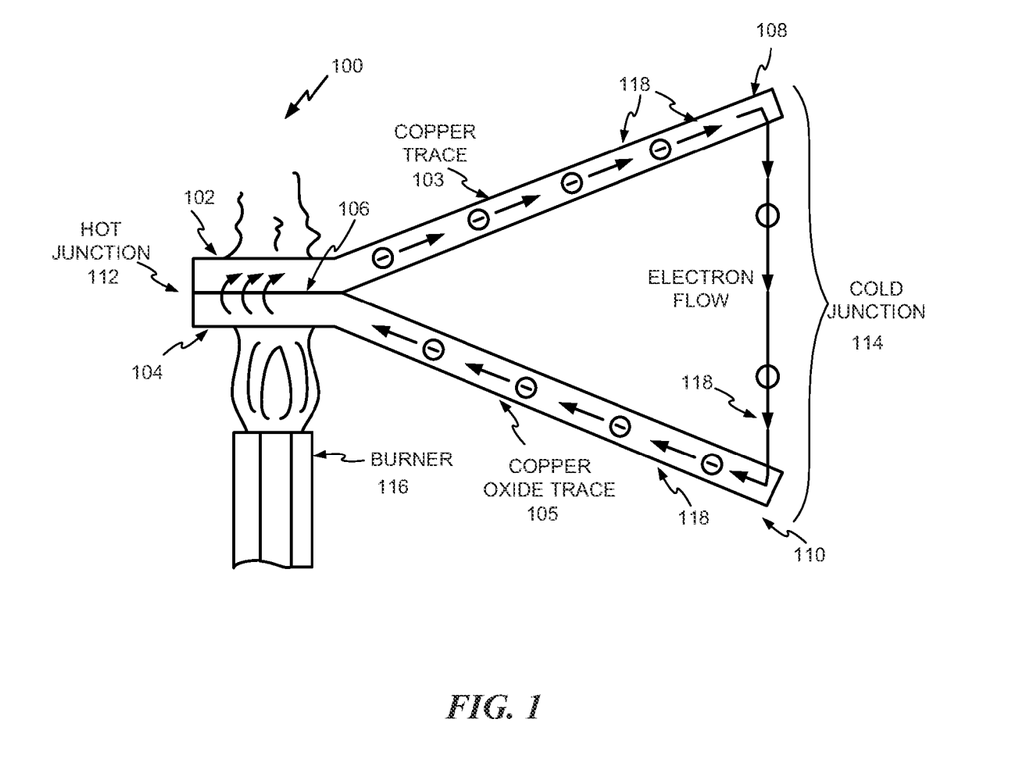
FIG. 1 is an exemplary illustration of a copper/copper oxide interconnect for energy harvesting according to some aspects of the disclosure.

FIG. 1 is an exemplary illustration of a copper/copper oxide pillar 100 for energy harvesting according to some aspects of the disclosure. The copper/copper oxide pillar 100 includes a copper portion 102 and a copper oxide layer 104. In some aspects of the disclosure, the copper portion 102 can be substantially cylindrical with the copper oxide layer 104 surrounding the outer surface of the copper portion 102 (better seen in FIG. 2). The copper/copper oxide pillar 100 forms an electrically conductive interconnect between a packaging substrate and a die, between a first die and a second die, between a first package and another package or between a packaging substrate and a printed circuit board of an electronic device. According to the present disclosure, the copper portion 102 of the pillar 100 is adjacent to and shares a common interface 106 with the copper oxide layer 104.

A copper trace 103 couples with the copper portion 102 of the pillar 100. A copper oxide trace 105 couples to the copper oxide layer 104 of the pillar 100. The traces 103, 105 are provided within a stacked die, packaging substrate or elsewhere within a package or within a printed circuit board. The traces 103, 105 gradually extend apart from each other and away from the interface 106 to a first distal region 108 and a second distal region 110, respectively. Although the extension of the copper trace 103 and the copper oxide trace 105 is described as gradual, the traces 103, 105 can also extend in different ways. For example, the copper trace 103 and the copper oxide trace 105 can extend away from each other in a stepwise manner (not shown).

A region around the interface 106 represents a first junction region 112 and a region around the first and the second distal regions 108 and 110 represent a second junction region 114. In the example shown in FIG. 1, the first junction 112 is a hot junction and the second junction 114 is a cold junction, although junction 112 could be a cold junction and junction 114 could be a hot junction.

To demonstrate the thermoelectric properties of the copper/copper oxide pillar 100, FIG. 1 includes a burner 116, which generates heat at the junction region 112, thereby creating a hot junction. The generated heat dissipates away from the hot junction 112 toward the first distal region 108 and the second distal region 110. The heat gradually diminishes from the hot junction 112 to a cold junction around the second junction region 114. Although the description includes a hot junction around the common interface 106 and the cold junction around the first distal region 108 and the second distal region 110, the junctions can be interchanged based on a temperature gradient between the junctions. That is, the first junction 112 can be a cold junction and the second junction 114 can be a hot junction.

The thermoelectric property of the copper/copper oxide pillar 100 is based on the thermoelectric potential between copper and copper oxide. Although the present description is with respect to copper and copper oxide, alternate materials for the pillar are also contemplated, for materials having similar thermoelectric properties. According to Table 1 below, the thermoelectric potential between copper and copper oxide is 1000 uV/deg C. (See The Metrology Handbook, Vol. 1 Table 31.2 American Society for Quality 2004—Bucher). The thermoelectric property of the copper/copper oxide pillar 100 is such that when heat is applied at the hot junction 112 a flow of electrons is initiated. The electrons may flow in the direction of the arrows 118 based on the hot-cold direction. A resistive load (not shown) away from the common interface 106 and between the first distal region 108 and the second distal region 110 closes the circuit between the distal regions by allowing the electrons to flow through the resistive load between the distal regions 108, 110. In the example where the hot junction is the first junction 112 and the cold junction is the second junction 114, the electrons flow from the copper portion 102 of the pillar 100 through the copper trace 103 to the cold junction 114 and then through the copper oxide trace 105 to the copper oxide layer 104 at the hot junction 112.

TABLE 1

Thermoelectric effects from connector materials

| Materials | Thermoelectric Potential |
|---|---|
| Copper - Copper | ≤0.2 µV/° C. |
| Copper - Silver | 0.3 µV/° C. |
| Copper - Gold | 0.3 µV/° C. |
| Copper - Lead/Tin solder | 1 to 3 µV/° C. |
| Copper - Nickel | 21 µV/° C. |
| Copper - Copper oxide | 1000 µV/° C. |

The flow of electrons generates electrical charge that can be stored in remote capacitors on the die, packaging substrate, or printed, circuit board. Various configurations of the capacitors are described in more detail with respect to FIGS. 2A and 2B.

As previously discussed, heat energy is recycled into electrical energy based on the thermoelectric properties of the copper (Cu) portion 102 and copper oxide (CuO) layer 104 interface that generally occurs in a copper column on a bond on lead (Cu-BOL) package technology. Each copper (Cu) portion 102 and copper oxide (CuO) layer 104 forms a CuBOL pillar pin or copper/copper oxide pillar 100 that may be coupled to a packaging substrate, die or a printed circuit board of the electronic device. In some aspects of the disclosure, the amount of charge flowing through the copper (Cu) portion 102 and copper oxide (CuO) layer 104 junctions is adjusted by varying the thickness or size of the copper (Cu) portion 102 and copper oxide (CuO) layer 104.

The thermoelectric potential for each CuBOL pillar pin can be calculated based, on the following: Assume the thermal gradient within an electronic device, e.g., cell phone, is 80 degrees centigrade. Assume that a single CuBOL pillar pin has enough copper/copper oxide interface to generate a thermoelectric potential. In one configuration, the copper oxide thickness is 1 micrometer and the copper/copper oxide interface is 10,557 micrometer squared. Of course, alternative dimensions can be substituted with the copper oxide even being thicker than the copper portion, in some configurations. Based on Table 1, the thermoelectric potential between copper and copper oxide is 1000 uV/degrees centigrade. The thermoelectric potential for each CuBOL pillar pin can be calculated by multiplying the thermal gradient by the thermal potential for each degree centigrade. This calculation results in a thermoelectric potential of 80 millivolts for each CuBOL pin. The 80 millivolts for each CuBOL pin can charge the remote capacitors (described with respect to FIGS. 2A-B).

Figure 2A:
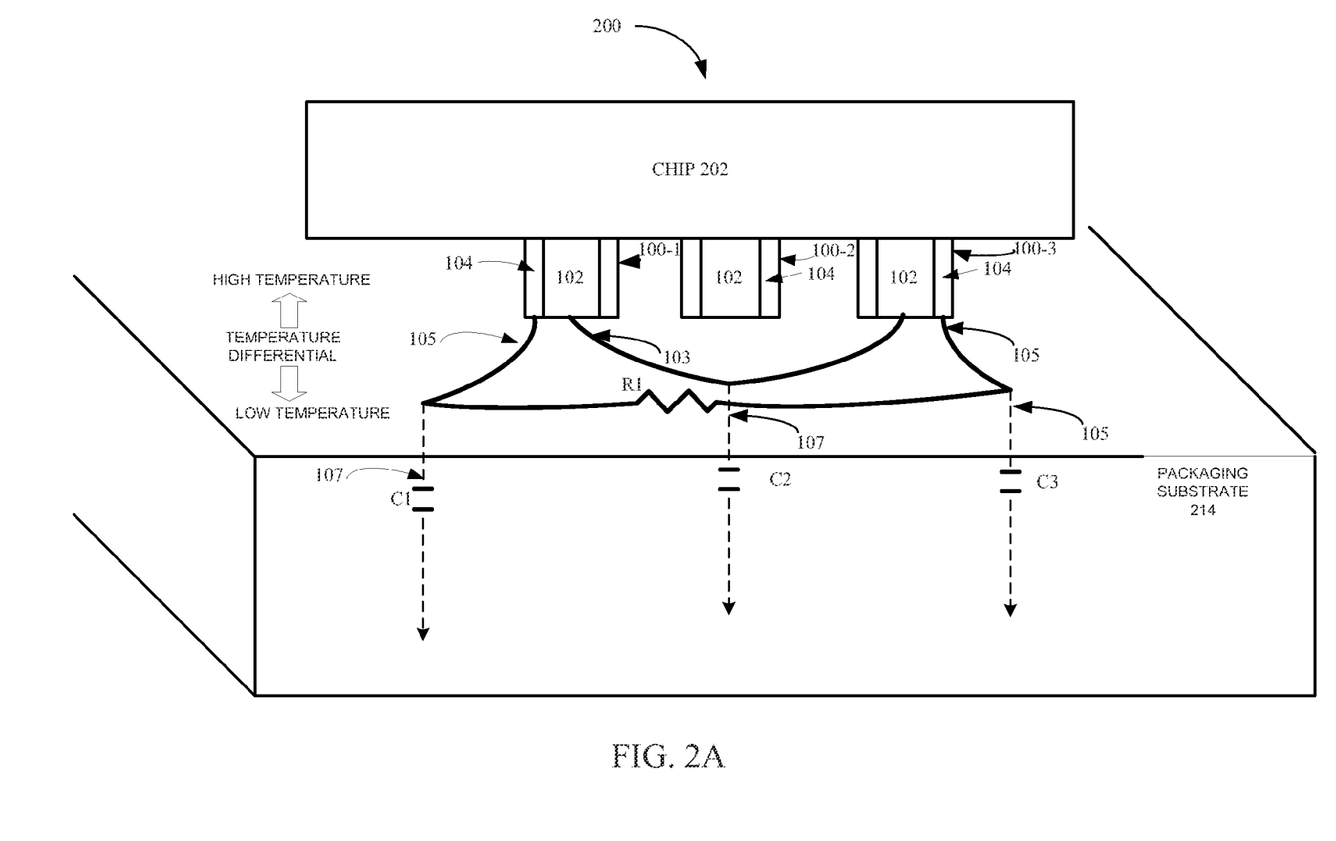
FIG. 2A illustrates a cross-sectional view of a system equipped with copper/copper oxide pillars and remote capacitors arranged in a parallel configuration.
Figure 2B:
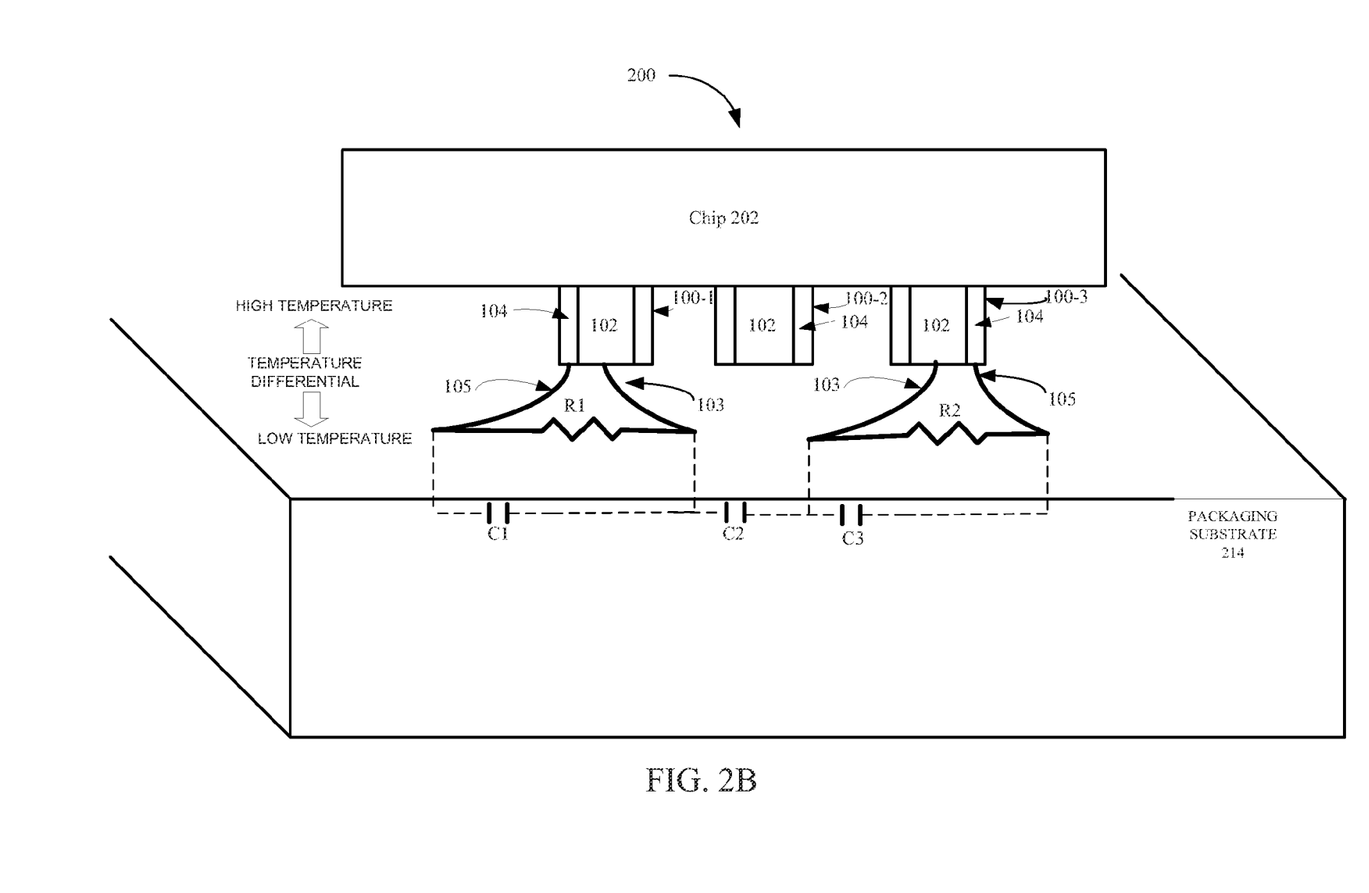
FIG. 2B illustrates a cross-sectional view of a system equipped with copper/copper oxide pillars and remote capacitors arranged in a series configuration.

FIGS. 2A and 2B illustrate a system 200 including copper/copper oxide pillars 100 and remote capacitors arranged in different configurations. For explanatory purposes, FIGS. 2A and 2B are described with reference to FIG. 1 above. The system 200 may include a chip 202 (e.g., PMIC processor, modem or any chip generating heat) and copper/copper oxide pillars 100 (100-1, 100-2 and 100-3). Some of the copper/copper oxide pillars 100 (e.g., 100-2) enable electrical signal communications between the chip 202 and a packaging substrate 214. Some of the copper/copper oxide pillars 100 (e.g., 100-1 and 100-3) are not connected for normal operation, i.e., they are non-connected pillars provided only for the purpose of generating thermoelectric potential. These non-connected copper/copper oxide pillars 100-1 and 100-3 and the corresponding remote capacitors C1, C2, and C3 may be stacked in a parallel configuration (FIG. 2A) or in a series configuration (FIG. 2B). Thus, the copper/copper oxide pillars 100-1 and 100-3 are configured to generate electrical energy to be stored in one or more of the remote capacitors C1-C3. In some aspects of the disclosure, the copper/copper oxide pillars 100 (e.g., 100-2) that are connected for normal operation are also coupled to remote capacitors like C1, C2 and C3 and thus are capable of generating and storing thermoelectric potential.

A copper trace 103 couple with the copper portion 102 of the pillars 100-1, 100-3 and a copper oxide trace 105 couple with the copper oxide layer 104 of the pillars 100-1, 100-3. The traces 103, 105 are within the packaging substrate 214 and gradually extend apart from each other and away from the common interface to distal regions. A resistive load R1, which is positioned away from the copper/copper oxide pillars 100, closes a circuit that includes the copper trace 103 and the copper oxide trace 105. In particular, the resistive load R1, allows electrons to flow from the copper trace 103 and the copper oxide trace 105 through the resistive load. In some aspects of the disclosure, the resistive load R1 is implemented between the copper oxide traces 105 and/or between the copper traces 103. The resistive load R1 can be implemented with a change in material between the copper and copper oxide traces 103, 105.

The copper (Cu) portions 102 and the copper oxide (CuO) layers 104 can be electrically coupled to the capacitors C1, C2, C3 with a connector 107, such as a via or other conductor. More specifically, each trace 103, 105 couples to a capacitor C11, C2, C3. In operation, an electric charge due to the thermal gradient or temperature differential between the junction region of the pillars 100-1, 100-3 (i.e., region subjected to high temperature) and the junction region at the ends of the traces 103, 105 (i.e., region subjected to low temperature) is transmitted through the traces 103, 105. The electrical charge can be stored in the capacitors C1, C2, C3 arranged in a parallel configuration. Of course, more than a single capacitor can be coupled to each trace, or only one of the traces for each pillar may be coupled to a capacitor.

As seen in FIG. 2B, the copper traces 103 are coupled to the copper oxide traces 105 via capacitors C1, C2 and C3 and some other connection 107, such as vias and/or traces. The copper oxide trace 105 extending from the copper oxide portion 104 of the pillar 100-1 is coupled to the copper trace 103 extending from the copper portion 102 of the pillar 100-1 by a resistive load R1 and the capacitor C1. The resistive load R1 and the capacitor C1 are arranged in a parallel configuration and positioned away from the from the copper/copper oxide pillars 100. The copper oxide trace 105 extending from the copper oxide portion 104 of the pillar 100-3 is coupled to the copper trace 103 extending from the copper portion 102 of the pillar 100-3 by a resistive load R2 and the capacitor C3. The resistive load R2 and the capacitor C3 are arranged in a parallel configuration. In some aspects of the disclosure, the capacitor C2, which is positioned away from the copper/copper oxide pillars 100, closes a circuit between the copper traces 103 and the copper oxide traces 105 of the pillars 100-1 and 100-3. The resistive loads R1 and R2 can be implemented as the material changes from copper to copper oxide.

In operation, an electric charge due to the thermal gradient, i.e., temperature differential, is transmitted through the traces 103, 105 and stored in the capacitors C1-C3. More specifically, each trace 103, 105 couples to a capacitor C1, C2, C3. In operation, an electric charge due to the thermal gradient between the junction region of the pillars 100-1, 100-3 (i.e., region subjected to higher temperature) and the junction region at the ends of the traces 103, 105 (i.e., region subjected to lower temperature) is transmitted through the traces 103, 105. The electrical charge can be stored in the capacitors C1, C2, C3. Of course, more than a single capacitor can be coupled to each trace 103, 105, or only one of the traces 103, 105 for each pillar 100 may be coupled to a capacitor.

In normal operation, the chip 202, e.g., PMIC, processor or modem generates heat causing the copper/copper oxide pillars 100 to heat up. In some aspects, conductive traces (not shown) in the chip 202 are provided between the copper/copper oxide pillars 100 and heat generating portions of the chip 202. These conductive traces can provide conductive pathways for collecting heat from an underlying circuit and funneling the heat to the copper/copper oxide pillars 100.

In some aspects of the disclosure, the heat generated by the chip 202 causes the junction region around the common interfaces of the pillars to become a hot junction. The heat is routed away from the hot junction to a cold junction on the packaging substrate. A thermal gradient exists between the hot junction and the cold junction. The traces 103, 105 are designed to extend apart from each other and away from the interface 106 to a first distal region 108 and a second distal region 110 to improve a thermal gradient between the hot junction and the cold junction.

In conjunction with the flow of heat, a thermal electric flow of electrons occurs. The flow of electrons generates electrical charges (thermoelectric potential) that can be stored in the remote capacitors C1-C3. In some aspects, multiple capacitors can be coupled to each of the junction regions. In other configurations, the capacitors are provided in a combination of series and parallel arrangements. In some aspects, two or more of the distal regions are coupled or tied together prior to being coupled to one or more of the capacitors C1-C3. The capacitors are arranged in series to generate a higher voltage or in parallel to generate more charge. In some aspects, the charge stored in the capacitors substitutes for the charge in the supercaps. Thus, the size of the supercaps can be reduced or eliminated altogether.

One advantage of the improved pillars is that they are natural to the packaging process. In particular, the improved pillars take advantage of the thermoelectric properties of the copper/copper oxide interface currently available in CuBOL packages. Recycling the thermal energy into electrical energy can also potentially create a reference voltage that can back bias the IC substrate, thereby reducing power leakage. In other words, voltage can be applied to the substrate to bias the "backsides" of transistors on the substrate. Reduced power leakage can reduce heat dissipation and allow for improved processor speed.

Figure 3:
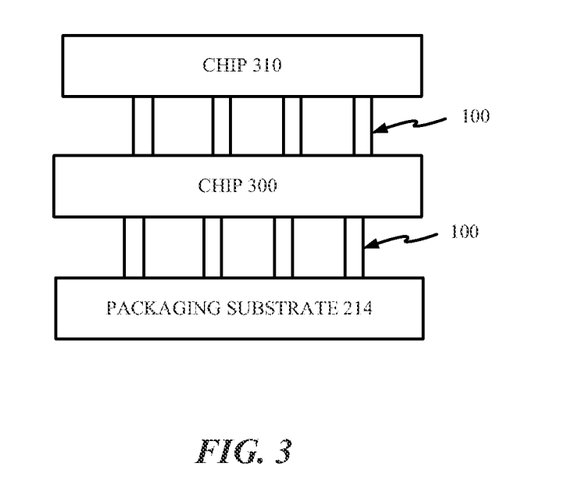
FIGS. 3-6 illustrate block diagrams of various package/die arrangements equipped with copper/copper oxide pillars.
Figure 4:
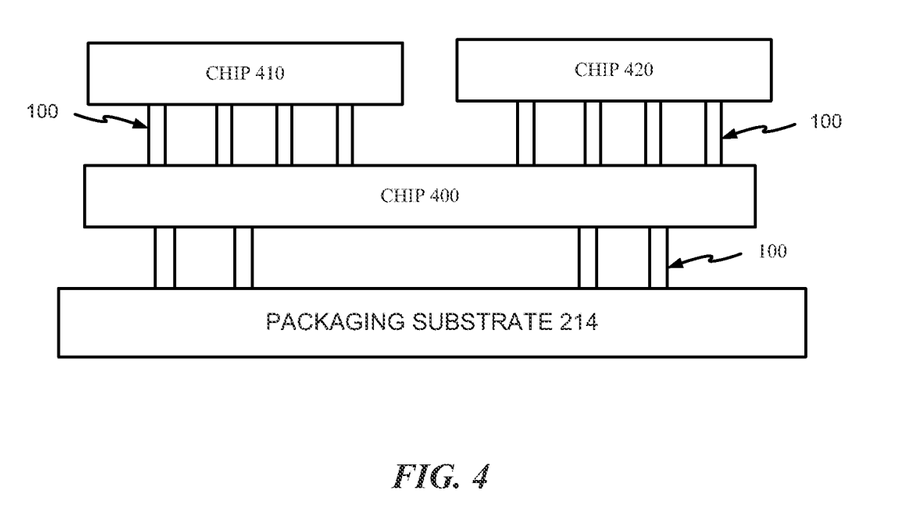

While the system 200 of FIGS. 2A and 2B shows only a single chip and a packaging substrate, the system may include a number of additional configurations. For example, FIGS. 3-4 illustrate block diagrams of stacked integrated circuits having copper/copper oxide pillars operating as die-to-die-connections, as well as chip to substrate connections. The copper/copper oxide pillars of the stacked devices can function as the copper/copper oxide pillars of FIGS. 2A and 2B provided sufficient thermal gradient exists between the junctions associated with the copper/copper oxide pillars. The system of FIG. 3 includes a packaging substrate 214 that supports a first chip 300 and a second chip 310. The packaging substrate 214 may be coupled to the first chip 300 via copper/copper oxide pillars 100. Stacked above the first chip 300 is the second chip 310. A set of copper/copper oxide pillars 100 couples the first chip 300 to the second chip 310. In this configuration, traces to the cold junction (not shown) could be located on one of the chips 300, 310 and on the packaging substrate 214. Similarly, the capacitors can be located within the opposite die and the packaging substrate 214.

The system of FIG. 4 includes a first chip 400 that supports a second chip 410 and a third chip 420. The second chip 410 and the third chip 420 are stacked on the same level above the first chip 400. A set of copper/copper oxide pillars 100 couples the first chip 400 to the second chip 410 and a set of copper/copper oxide pillars 100 couples the first chip 400 to the third chip 410. In this configuration, traces to the cold junction (not shown) could be located on one of the chips 400, 410, 420 and the packaging substrate. Similarly, the capacitors can be located within the opposite chip 400, 410, 420 and the packaging substrate. A packaging substrate 214 may be coupled to the first chip 410 via copper/copper oxide pillars 100.

Figure 5:
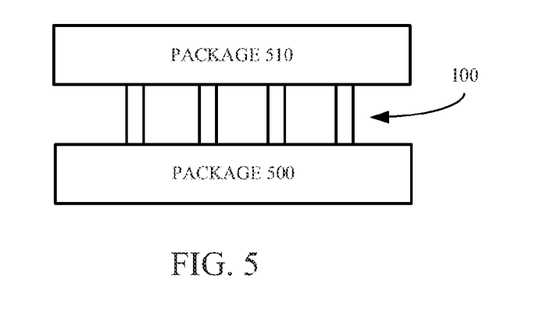

The system of FIG. 5 includes a first package 500 stacked on a second package 510 in a package on package (POP configuration). The first package 500 is coupled to the second package 510 via copper/copper oxide pillars 100. In this configuration, traces to the cold junction (not shown) could be located on one of the packages 500 and 510. Similarly, the capacitors can be located within one of the packages 500 and 510.

Figure 6:
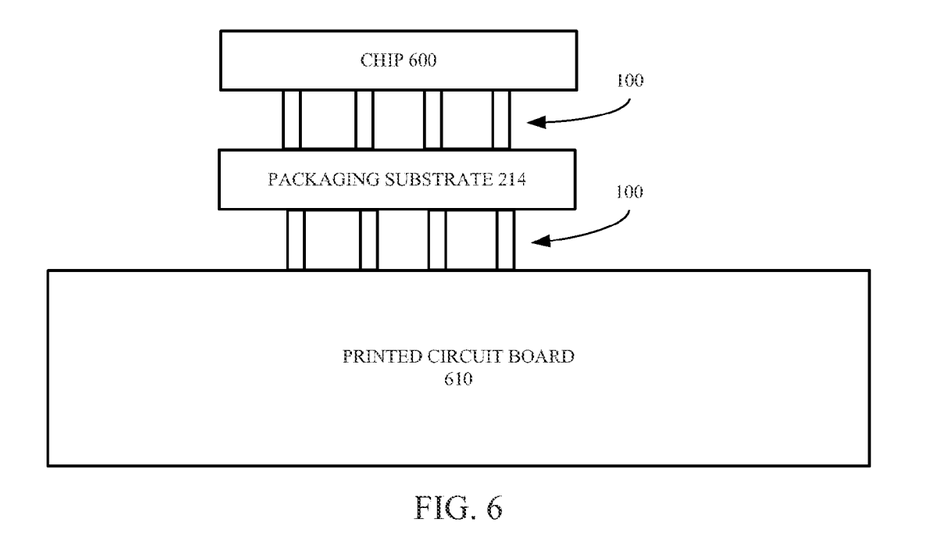

The system of FIG. 6 includes a packaging substrate 214 that supports a first chip 600. The packaging substrate 214 may be coupled to the first chip 600 on a first side via copper/copper oxide pillars 100 and to a printed circuit board 610 on an opposite side through packaging connections 100. In some aspects, the packaging connections 100 include copper/copper oxide pillars such as illustrated in FIGS. 2A and 2B. The traces for the pillars 100 and capacitors (not shown) between the printed circuit board 610 and the packaging substrate 214 can be provided on the printed circuit board 610.

Figure 7:
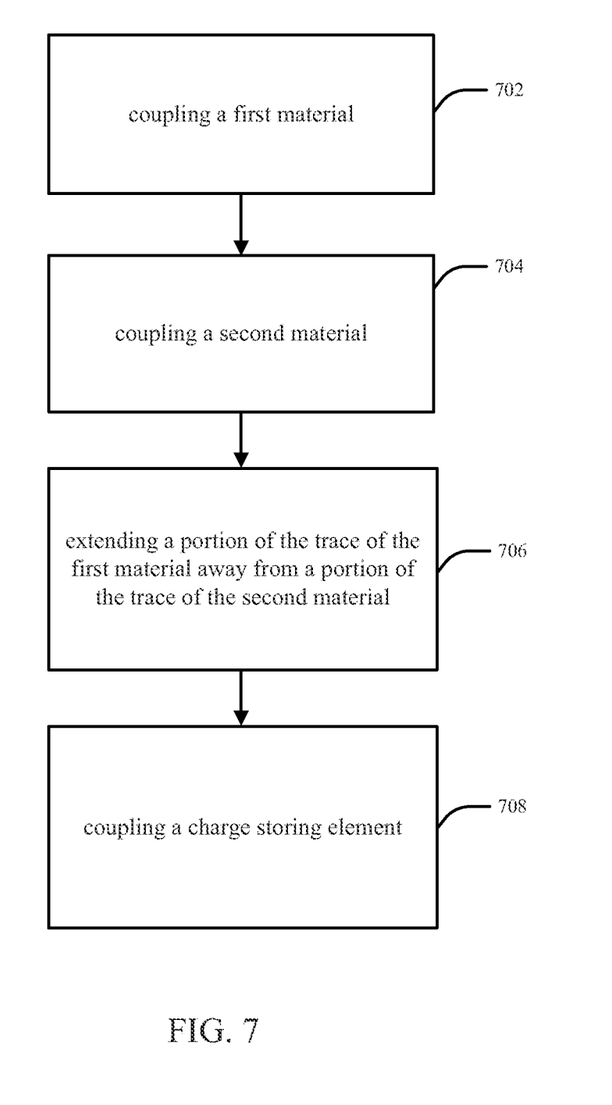
FIG. 7 illustrates a method for energy harvesting according to some aspects of the disclosure.

FIG. 7 illustrates a method for energy harvesting according to some aspects of the disclosure. At block 702, the method starts with coupling a first material of each electrical connector of a group of electrical connectors to a trace of the first material. At block 704 a second material of each electrical connector is coupled to a trace of the second material. The first material and the second material have a thermoelectric potential. At block 706, a portion of the trace of the first material is extended away from a portion of the trace of the second material. At block 708 charge storing elements are coupled to at least one of the traces.

In one configuration, the energy harvesting integrated circuit (IC) apparatus includes means for electrically connecting integrated circuit devices. In one aspect of the disclosure, the connecting means may be the copper/copper oxide pillars 100 configured to perform the functions recited by the connecting means. In one configuration, the energy harvesting integrated circuit (IC) apparatus includes means for storing electric charge. In one aspect of the disclosure, the electric charge storing means may be the capacitors C1, C2 and/or C3 configured to perform the functions recited by the electric charge storing means.

Figure 8:
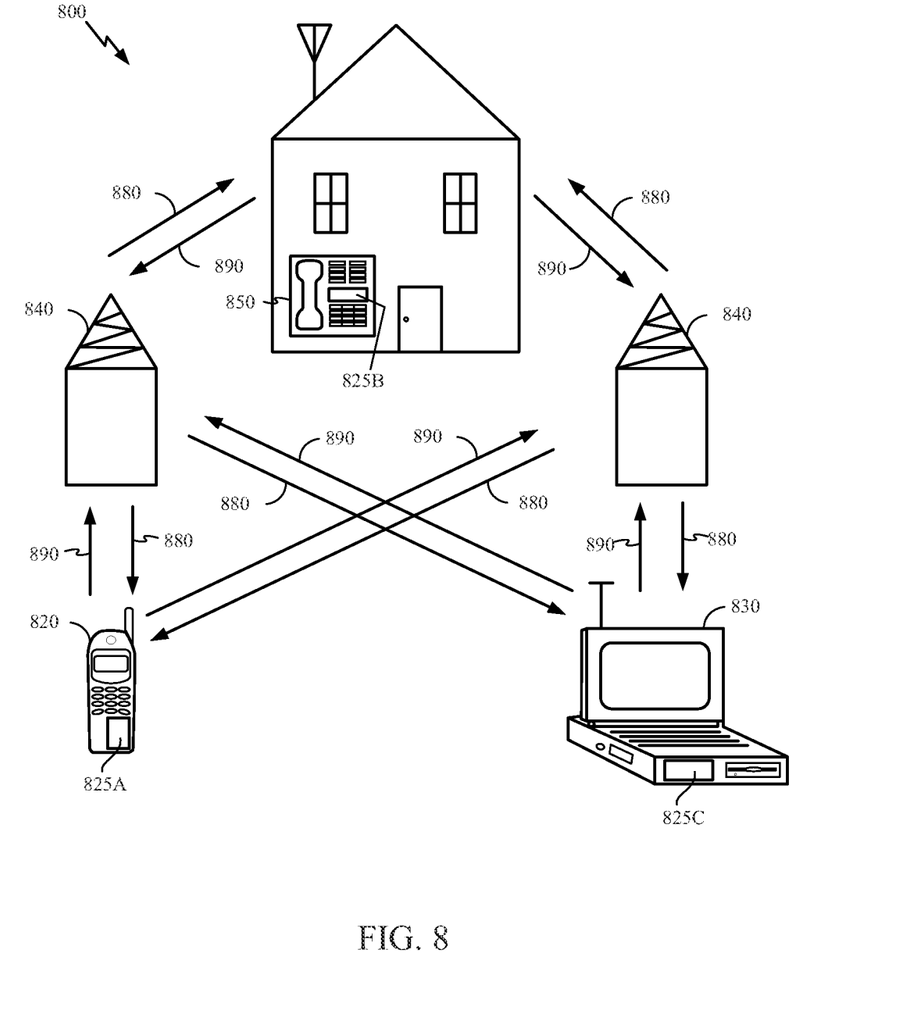
FIG. 8 is a block diagram showing an exemplary wireless communication system in which an aspect of the disclosure may be advantageously employed.

FIG. 8 is a block diagram showing an exemplary wireless communication system 800 in which an aspect of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825C and 825B, which include the disclosed energy harvesting integrated circuit package. It will be recognized that other devices may also include the disclosed energy harvesting integrated circuit package, such as the base stations, switching devices, and network equipment. FIG. 8 shows forward link signals 880 from the base station 840 to the remote units 820, 830, and 850 and reverse link signals 890 from the remote units 820, 830, and 850 to base stations 840.

In FIG. 8, remote unit 820 is shown as a mobile telephone, remote unit 830 is shown as a portable computer, and remote unit 850 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 8 illustrates remote units according to the teachings of the disclosure, the disclosure is not limited to these exemplary illustrated units. Aspects of the disclosure may be suitably employed in any device, which includes the energy harvesting integrated circuit package.

The methodologies described, herein may be implemented by various means depending upon the application. For example, these methodologies may be implemented in hardware, firmware, software, or any combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, electronic devices, other electronic units designed to perform the functions described herein, or a combination thereof.

For a firmware and/or software implementation, the methodologies may be implemented with modules (e.g., procedures, functions, and so on) that perform the functions described herein. Any machine or computer readable medium tangibly embodying instructions may be used in implementing the methodologies described herein. For example, software code may be stored in a memory and executed by a processor. When executed by the processor, the executing software code generates the operational environment that implements the various methodologies and functionalities of the different aspects of the teachings presented herein. Memory may be implemented within the processor or external to the processor. As used herein, the term "memory" refers to any type of long term, short term, volatile, nonvolatile, or other memory and is not to be limited to any particular type of memory or number of memories, or type of media upon which memory is stored.

The machine or computer readable medium that stores the software code defining the methodologies and functions described herein includes physical computer storage media. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to store desired program code in the form of instructions or data structures and that can be accessed by a computer. As used herein, disk and/or disc includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present teachings and their advantages have been described in detail, it should be understood that various changes, substitutions and alterations can be made herein without departing from the technology of the teachings as defined by the appended claims. Moreover, the scope of the present application is not intended to be limited to the particular aspects of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding aspects described herein may be utilized according to the present teachings. Accordingly, the appended claims are intended to include within their scope such processes, machines, manufacture, compositions of matter, means, methods, or steps.

What is claimed is:

1. An energy harvesting integrated circuit (IC) apparatus, comprising:
   a plurality of electrical connectors, each connector comprising a first material and a second material, the first and the second materials having a thermoelectric potential;
   a first trace of the first material coupled to the first material of each electrical connector;
   a second trace of the second material coupled to the second material of each electrical connector and the first trace, a portion of the second trace extending away from a portion of the first trace; and
   a plurality of charge storing elements coupled to at least one of the first and second traces.

2. The apparatus of claim 1, in which the electrical connectors comprise pillars.

3. The apparatus of claim 2, in which the pillars are substantially cylindrical and the second material substantially surrounds the first material of each of the pillars.

4. The apparatus of claim 1, in which the first material comprises copper and the second material comprises copper oxide.

5. The apparatus of claim 4, in which each electrical connector comprises an interior layer and an exterior layer, the interior layer comprising the first material and the exterior layer comprising the second material.

6. The apparatus of claim 1, in which the charge storing elements comprise capacitors.

7. The apparatus of claim 6, in which the capacitors are arranged in a parallel configuration.

8. The apparatus of claim 6, in which the capacitors are arranged in a series configuration.

9. The apparatus of claim 1, further comprising a die coupled to a packaging substrate with the electrical connectors.

10. The apparatus of claim 1, further comprising a first die coupled to a second die with the electrical connectors.

11. The apparatus of claim 1, further comprising a printed circuit board coupled to a packaging substrate with the electrical connectors.

12. The apparatus of claim 1, further comprising a first package coupled to a second package with the electrical connectors.

13. The apparatus of claim 1, in which the portion of the first trace gradually extend away from the portion of the second trace.

14. The apparatus of claim 1, in which the portion of the first trace step-wise extend away from the portion of the second trace.

15. The apparatus of claim 1, further comprising at least one resistive load electrically coupling the first trace to the second trace.

16. The apparatus of claim 1, in which the first material and the second material are subjected to heat to create an electron flow based on a thermal gradient between a first zone of the heated first and second materials and a second zone associated with the first and the second materials away from the first zone.

17. The apparatus of claim 1, in which at least one of the plurality of electrical connectors carries a signal and in which at least one of the plurality of electrical connectors generates the thermoelectric potential.

18. The apparatus of claim 1, integrated into at least one of a mobile phone, a set top box, music player, video player, entertainment unit, navigation device, communications device, personal digital assistant (PDA), fixed location data unit, microprocessor and a computer.

19. An energy harvesting method, comprising:
   coupling a first material of each electrical connector of a plurality of electrical connectors to a trace of the first material;
   coupling a second material of each electrical connector of the plurality of electrical connectors to a trace of the second material, the first material and the second material having a thermoelectric potential;
   extending a portion of the trace of the first material away from a portion of the trace of the second material; and
   coupling a plurality of charge storing elements to at least one of the traces.

20. The method of claim 19, further comprising integrating the electrical connector into at least one of a mobile phone, a set top box, music player, video player, entertainment unit, navigation device, communications device, personal digital assistant (PDA), fixed location data unit, microprocessor and a computer.

21. An energy harvesting integrated circuit (IC) apparatus, comprising:
- means for electrically connecting integrated circuit devices, each connecting means comprising a first material and a second material, the first and the second materials having a thermoelectric potential;
- a first trace of the first material coupled to the first material of each connecting means;
- a second trace of the second material coupled to the second material of each connecting means and the first trace, a portion of the second trace extending away from a portion of the first trace; and
- means for storing electric charge coupled to at least one of the first and second traces.

22. The apparatus of claim 21, integrated into at least one of a mobile phone, a set top box, music player, video player, entertainment unit, navigation device, communications device, personal digital assistant (PDA), fixed location data unit, microprocessor and a computer.

* * * * *